US007486152B2

(12) United States Patent
Kato

(10) Patent No.: US 7,486,152 B2
(45) Date of Patent: Feb. 3, 2009

(54) VOLTAGE CONTROLLED OSCILLATOR

(75) Inventor: Akira Kato, Osaka-fu (JP)

(73) Assignee: Murata Manufacturing Co., Ltd. (JP)

(*) Notice: Subject to any disclaimer, the term of this patent is extended or adjusted under 35 U.S.C. 154(b) by 106 days.

(21) Appl. No.: 10/597,921

(22) PCT Filed: Nov. 18, 2004

(86) PCT No.: PCT/JP2004/017145

§ 371 (c)(1),
(2), (4) Date: May 7, 2007

(87) PCT Pub. No.: WO2005/078915

PCT Pub. Date: Aug. 25, 2005

(65) Prior Publication Data

US 2008/0266013 A1 Oct. 30, 2008

(30) Foreign Application Priority Data

Feb. 17, 2004 (JP) ............................ 2004-039791

(51) Int. Cl.
*H03B 1/00* (2006.01)

(52) U.S. Cl. ...................... 331/177 V; 331/16; 331/34; 331/185

(58) Field of Classification Search ............. 331/177 V, 331/16, 34, 185
See application file for complete search history.

(56) References Cited

U.S. PATENT DOCUMENTS 3,614,649 A * 10/1971 Gerig .......................... 331/17
3,619,803 A * 11/1971 Klein ............................ 331/8
4,297,655 A * 10/1981 Fujii et al. .............. 331/116 R

FOREIGN PATENT DOCUMENTS

| | | |
|---|---|---|
| JP | 59-229914 | 12/1984 |
| JP | 4-179306 | 6/1992 |
| JP | 4-320102 | 11/1992 |
| JP | 6-45826 | 2/1994 |
| JP | 6-252640 | 9/1994 |
| JP | 8-10807 | 1/1996 |

(Continued)

OTHER PUBLICATIONS

International Search Report dated Mar. 28, 2005.

*Primary Examiner*—Arnold Kinkead
(74) *Attorney, Agent, or Firm*—Ostrolenk, Faber, Gerb & Soffen, LLP

(57) ABSTRACT

The cathode of a first varactor diode (VD1) is connected to a resonator element (XD) of an oscillator (2) via a capacitor (C1) and is connected to a triangular wave generator circuit (3) via an inductor (RFC1) and a resistor element (R1), whereas the anode is connected to the cathode of a second varactor diode (VD2) via a capacitor (C2) and is grounded via an inductor (RFC3). The cathode of a zener diode (ZD1) is connected to a node of the inductor (RFC1) and the resistor element (R1), whereas the anode is grounded via a resistor element (R2). The cathode of the second varactor diode (VD2) is connected to a node of the zener diode (ZD1) and the resistor element (R2) via an inductor (RFC2), whereas the anode is grounded. In other embodiments, certain component (s) may be omitted and/or a fixed supply potential may be substituted for the ground potential.

9 Claims, 7 Drawing Sheets

FOREIGN PATENT DOCUMENTS

| | | |
|---|---|---|
| JP | 9-98152 | 4/1997 |
| JP | 10-56329 | 2/1998 |
| JP | 2756739 | 3/1998 |
| JP | 2000-183648 | 6/2000 |
| JP | 2003-101408 | 4/2003 |

* cited by examiner

Vt0 (V)
2.0
Vz
(a)
0.0
5.0
6.0
7.0
8.0
9.0
t
VVD1 (V)
2.0
(b)
0.0
5.0
6.0
7.0
8.0
9.0
t
VVD2 (V)
2.0
α
β
(c)
0.0
5.0
6.0
7.0
8.0
9.0
t (a)
C (pF)
80
60
40
20
Vφ
V (V)
-1.0
0
1.0
2.0
3.0
(b)
$C_{VD1}$ (pF)
60
50
40
30
20
10
0
t
5.0 5.5 6.0 6.5 7.0 7.5 8.0 8.5 9.0
(c)
$C_{VD2}$ (pF)
60
50
40
30
20
10
0
t
5.0 5.5 6.0 6.5 7.0 7.5 8.0 8.5 9.0
(d)
$C_{VD}$ (pF)
26
24
22
20
18
16
14
12
10
t
5.0 5.5 6.0 6.5 7.0 7.5 8.0 8.5 9.0

V
(a)
t
$C_{VD}$
(b)
t
f
(c)
t

VOLTAGE CONTROLLED OSCILLATOR

CROSS REFERENCE TO RELATED APPLICATION

The present application is a 35 U.S.C. §371 national phase conversion of PCT/JP2004/017145 filed Nov. 18, 2004, which claims priority of Japanese application no. JP2004-039791 filed Feb. 17, 2004, which are incorporated herein in their entirety.

BACKGROUND OF THE INVENTION

1. Technical Field

The present invention relates to a voltage controlled oscillator configured to control oscillation frequency by applying a voltage signal and, more specifically, relates to a frequency spread voltage controlled oscillator configured to output an oscillation signal while changing the oscillation frequency within short periods of time.

2. Related Art

Nowadays, for digital signal transmission, parallel transmission and serial transmission are both used. However, for transmitting a large volume of signals at high speed, serial transmission is mainly used. To serially transmit a digital signal, clocking is required as a reference for the transmission. As the amount of information to be transmitted increases, the transmission rate increases and the clock frequency becomes high. As the clock frequency is increased, high frequency signals at relatively high levels are continuously transmitted in response to the clock frequency. A problem has arisen in that these signals negatively affect peripheral devices as noise (electro-magnetic interference) (hereinafter referred to as EMI).

To solve this problem, various voltage controlled oscillators (VCOs) employing a spread spectrum method in which the clock frequency is changed over time and spread so as to prevent the noise being concentrated at a particular frequency has been discussed (for example, refer to Patent Documents 1 to 4).

Patent Document 1: Japanese Unexamined Patent Application Publication No. 9-98152

Patent Document 2: Japanese Unexamined Patent Application Publication No. 2003-101408

Patent Document 3: Japanese Patent Application No. 2756739

Patent Document 4: Japanese Examined Patent Application Publication No. 8-10807).

The above-described VCOs, however, have various shortcomings. As a method of controlling the oscillation frequency (oscillation frequency), the above-described voltage controlled oscillators employ a method of connecting a varactor diode (variable capacitance diode) to a resonator element included in an oscillator circuit and applying a variable voltage signal whose amplitude changes over time to the varactor diode. In general, a triangular wave signal is used for the voltage signal.

The varactor diode has a characteristic as shown in FIG. 9.

FIG. 9 illustrates the characteristic of the applied voltage with respect to the capacitance of the varactor diode.

As shown in FIG. 9, the change rate of the capacitance of the varactor diode decreases as the voltage applied to the varactor diode increases, whereas the change rate of the capacitance of the varactor diode increases as the voltage applied to the varactor diode decreases. Consequently, when a triangular wave signal is applied, the change rate of the capacitance is lower in the sections of the triangular wave signal where the applied voltage is higher, that is, in the sections near the peaks of the triangular wave.

FIGS. 10(*a*)-10(*c*) illustrate the changes over time of the signal applied to the varactor diode, the capacitance of the varactor diode, and the oscillation frequency of the voltage controlled oscillator including the varactor diode, wherein FIG. 10(*a*) illustrates the applied voltage, FIG. 10(*b*) illustrates the capacitance of the varactor diode, and FIG. 10(*c*) illustrates the oscillation frequency of the voltage controlled oscillator. This drawing illustrates the characteristic of a case in which the cathode of the varactor diode is connected to a resonator element and the anode is grounded.

As shown in FIGS. 10(*a*)-(*c*), when a triangular wave signal is applied, the changes over time of the capacitance of the varactor diode and the oscillation frequency of the oscillator become gentle near one of the peaks of the triangular wave signal (for the capacitance, the peak on the high capacitance side and, for the oscillation frequency, the peak on the low frequency side) and become abrupt near the other peak (for the capacitance, the peak on the low capacitance side and, for the oscillation frequency, the peak on the high frequency side).

Therefore, when a triangular wave signal is applied, in the sections where the change of the oscillation frequency is gentle, there is a problem in that the frequency spread effect (EMI noise reduction effect) is insufficient.

SUMMARY OF THE INVENTION

It would therefore be desirable to provide a voltage controlled oscillator that is capable of achieving sufficient frequency spread effect (EMI reduction effect) for reducing noise even when a triangular wave signal is applied.

A voltage controlled oscillator according to one embodiment of the present invention may include: an oscillator circuit configured to generate a predetermined oscillation frequency signal, the oscillator circuit including a resonator element; and an oscillation frequency controller circuit configured to control the oscillation frequency of the oscillator circuit by a control voltage signal. The oscillation frequency controller circuit may include: a first series circuit disposed between one end of the resonator element and a fixed potential, the first series circuit being constituted of a first varactor diode and a second varactor diode connected in series in this order from the resonator element side for carrying an alternating current; and a second series circuit disposed between an input terminal of the control voltage signal and the fixed potential, the second series circuit being constituted of a zener diode and a resistor element connected in series in this order from the input terminal side. A terminal of the first varactor diode on the resonator element side and a terminal of the zener diode on the input terminal side may be connected for carrying a direct current. A terminal of the second varactor diode on the first varactor diode side and a terminal of the resistor element on the zener diode side may be connected for carrying a direct current.

According to this configuration, the following operations can be carried out.

(1) In sections where the amplitude (voltage) of the applied control voltage signal is low, the zener diode is not conductive. Therefore, a voltage is not applied to the resistor element, and zero voltage is applied to the second varactor diode. The second varactor diode functions as a capacitor having capacitance corresponding to the applied zero voltage.

On the other hand, since the control voltage signal is applied to the first varactor diode, the first varactor diode functions as a capacitor in which the capacitance changes in correspondence to the applied voltage. In accordance with the change in capacitance of the first varactor diode, the combined capacitance of the series circuit of the first varactor diode and the second varactor diode changes. Since the series circuit is connected between one end of the resonator element of the oscillator circuit and a fixed potential in respect to an alternating current, the oscillation frequency of the oscillator circuit changes according to the change in the capacitance of the series circuit. Here, as described above, since the change in capacitance according to a change in voltage is not gentle in the low voltage sections of the control voltage signal, the change in the oscillation frequency does not become gentle, so that the frequency of the noise is spread out.

(2) On the other hand, in the sections where the amplitude (voltage) of the applied control voltage signal is high, the zener diode functions as a constant voltage element through break down. Consequently, a differential voltage is obtained by subtracting the break down voltage of the zener diode from the voltage of the control voltage signal to the resistor element, and this differential voltage is also applied to the second varactor diode. In this way, the second varactor diode functions as a capacitor whose capacitance changes in accordance with the applied voltage. According to the change in the capacitance of the second varactor diode, the combined capacitance of the series circuit of the first varactor circuit and the second varactor circuit changes. According to the change in the capacitance of the series circuit, the oscillation frequency of the oscillator circuit changes. Here, a low voltage obtained by subtracting the break down voltage of the zener diode from the voltage of the control voltage signal is applied to the second varactor diode. Therefore, the change in the capacitance of the series circuit due to the voltage change in the control voltage signal and the change in the oscillation frequency do not become gentle, so that the frequency of noise is spread out.

The foregoing describes an example of a basic circuit configuration according to an embodiment of the present invention.

In the voltage controlled oscillator according to this embodiment of the present invention, the terminal of the first varactor diode on the second varactor side is connected to the fixed potential and carries direct current.

According to this configuration, a specific circuit illustrated in FIG. 1 corresponding to the above-described basic circuit configuration is provided, and the following operations are carried out (refer to FIG. 1).

(3) In the sections where the amplitude (voltage) of the triangular wave signal that is the control voltage signal is low, the first varactor diode and the second varactor diode both operate in the same manner as the above-described case (1). Therefore, the change in the oscillation frequency does not become gentle, and the frequency of noise is spread out.

(4) In the sections where the amplitude (voltage) of the triangular wave signal exceeds the break down voltage of the zener diode, the zener diode becomes conductive, and the triangular wave signal is applied to the resistor element connected in series with the zener diode. Consequently, a voltage obtained by subtracting the break down voltage from the voltage of the triangular wave signal is applied to the second varactor diode. The capacitance of the second varactor diode changes according to this voltage. At this time, this voltage applied to the second varactor diode is a low voltage obtained by subtracting the break down voltage from the voltage of the original triangular wave signal. Accordingly, the change in the capacitance of the second varactor diode does not become gentle.

On the other hand, by connecting (for example, grounding) the terminal of the first varactor diode on the second varactor side to the fixed potential with respect to direct currents, the triangular wave signal is applied also to the first varactor diode. In this case, since a high voltage at near the peak of the triangular wave signal is applied to the first varactor diode, the change in the capacitance is gentle.

In this way, the change in the capacitance of the second varactor diode, together with the change in the capacitance of the first varactor diode, causes the combined capacitance to change abruptly in accordance with the change in voltage even in sections where the voltage is high near the peaks of the triangular wage signal. Accordingly, the oscillation frequency of the oscillator circuit changes abruptly, and the frequency of noise is spread out.

According to another embodiment of the present invention, the terminal of the first varactor diode on the second varactor diode side is connected to the terminal of the zener diode on the resistor element side with respect to direct currents.

According to this configuration, a specific circuit illustrated in FIG. 5 corresponding to the above-described basic circuit configuration is configured, and the following operations can be carried out (refer to FIG. 5).

(5) In the sections where the amplitude (voltage) of the triangular wave signal is low, the first varactor diode and the second varactor diode both operate in the same manner as the above-described case (1). Therefore, the change in the oscillation frequency does not become gentle, and the frequency of noise is spread out.

(6) In the sections where the amplitude (voltage) of the triangular wave signal exceeds the break down voltage of the zener diode, the second varactor diode operates in the same manner as the above-described case (4). On the other hand, by connecting the second varactor diode side of the first varactor diode to the resistor element side of the zener diode, a voltage corresponding to the decrease in the voltage of the resistor element is constantly applied to the second varactor diode side of the first varactor diode. In other words, since the zener diode functions as a constant voltage element when a voltage exceeding the break down voltage is applied, even when the voltage of the triangular wave signal changes, only a voltage equivalent to the break down voltage of the zener diode is applied to the first varactor diode. Therefore, the capacitance of the first varactor diode substantially does not change. However, since the change of the second varactor diode is abrupt, the combined capacitance of the capacitance of the first varactor diode and the capacitance of the second varactor diode does not change gently with respect to the change of the voltage. Accordingly, the change of the oscillation frequency of the voltage controlled oscillator does not become gentle, and the frequency of noise is relatively spread out. Since this circuit (FIG. 5) has a relatively small number of components compared with the above-described circuit (FIG. 1), the size of the circuit is reduced.

Thus, the disclosed embodiments of the present invention provide a voltage controlled oscillator that is capable of spreading out the frequency of noise by abruptly changing the oscillation frequency in accordance with the applied voltage value, without depending on the amplitude (voltage) of the control voltage signal. In other words, a voltage controlled oscillator having an excellent EMI reduction effect can be configured, and such a voltage controlled oscillator having such an excellent EMI reduction effect can be configured with a simple and small structure.

Other features and advantages of the present invention will become apparent from the following description of embodiments of invention which refers to the accompanying drawings.

DETAILED DESCRIPTION OF EMBODIMENTS OF THE INVENTION

A voltage controlled oscillator according to a first embodiment of the present invention will be described with reference to FIGS. 1 to 4.

Figure 1:
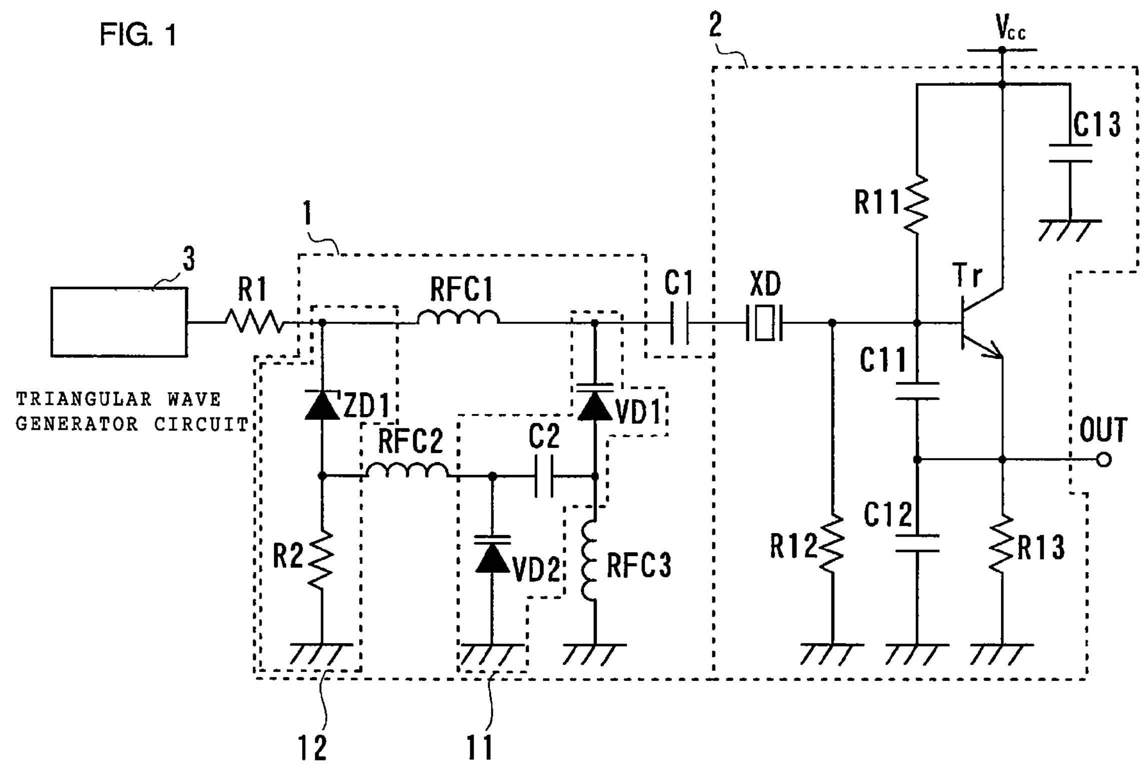
FIG. 1 is an equivalent circuit diagram illustrating a voltage controlled oscillator according to a first embodiment.

FIG. 1 illustrates an equivalent circuit diagram of the voltage controlled oscillator according to this embodiment.

As shown in FIG. 1, the voltage controlled oscillator includes a oscillator circuit 2 having a resonator element XD and a oscillation frequency controller circuit 1 connected to one end of the resonator element XD.

The oscillation frequency controller circuit 1 is connected to a triangular wave generator circuit 3 that is configured to generate a triangular wave voltage signal obtained by changing the voltage value over time via a resistor element R1. This triangular wave voltage signal is referred to as a "control voltage signal" according to the present invention.

The cathode of a zener diode ZD1 is connected to the node of the resistor element R1 and the oscillation frequency controller circuit 1, i.e., the input terminal of the oscillation frequency controller circuit 1, whereas the anode of the zener diode ZD1 is grounded via a resistor element R2. The cathode of the zener diode ZD1 is connected to the cathode of a first varactor diode VD1 via an inductor RFC1. The anode of the first varactor diode VD1 is connected to the cathode of a second varactor diode VD2 via a high-frequency bypass capacitor C2. The anode of the second varactor diode VD2 is grounded. The cathode of the first varactor diode VD1 is connected to the resonator element XD of the oscillator circuit 2 via a capacitor C1. Accordingly, a series circuit including the first varactor diode VD1, the high-frequency bypass capacitor C2, and the second varactor diode VD2 are connected in series to the resonator element XD with respect to high frequencies (alternating currents). The anode of the first varactor diode VD1 is grounded via an inductor RFC3. The cathode of the second varactor diode VD2 is connected to the resistor element R2 via an inductor RFC2.

In this way, in the oscillation frequency controller circuit 1 according to this embodiment, a series circuit 11 connecting the first varactor diode VD1 and the second varactor diode VD2 with respect to alternating currents is connected between one end of the resonator element XD and the ground, and a series circuit 12 of the zener diode ZD1 and the resistor element R2 is connected between the input terminal of the oscillation frequency controller circuit 1 and the ground. The cathode of the first varactor diode VD1 and the cathode of the zener diode ZD1 are connected, and the resistor element R2 and the second varactor diode VD2 are connected in parallel with respect to direct currents. Here, the series circuit 11 including the first and second varactor diodes VD1 and VD2 is a "first series circuit" in this embodiment of the present invention, and the series circuit 12 including the zener diode ZD1 and the resistor element R2 is a "second series circuit" in this embodiment of the present invention.

Here, the inductance values of the inductors RFC1 to RFC3 are set so that the inductors RFC1 to RFC3 have relatively low impedance for the frequency of a triangular wave signal and have extremely high impedance for the oscillation frequency. In this way, the oscillation frequency signal generated at the oscillator circuit 2 is not transmitted to the triangular wave generator circuit 3 side nor the resistor element R2 side. The first varactor diode VD1 is grounded with respect to direct currents. According to this embodiment, this ground is equivalent to a "fixed potential" according to the present invention.

A circuit including the first and second varactor diodes VD1 and VD2, the zener diode ZD1, the resistor element R2, the high-frequency bypass capacitor C2, and the inductors RFC1 to RFC3 constitute the oscillation frequency controller circuit 1.

As described above, one end of the resonator element XD of the oscillator circuit 2 is connected to the series circuit 11 including the first varactor diode VD1 and the second varactor diode VD2 of the oscillation frequency controller circuit 1 via the capacitor C1 with respect to high frequencies (alternating currents), whereas the other end of the resonator element XD is connected to the base of a transistor Tr having negative resistance at frequencies near the oscillation frequency. Here, as the resonator element XD, for example, a piezoelectric transducer or a quartz transducer is used. The base of the transistor Tr is connected to an input terminal of a driving voltage Vcc via a resistor element R11 and is grounded via a resistor element R12. A capacitor C11 for feedback is connected between the base and the emitter of the transistor Tr. The emitter of the transistor Tr is grounded via both a resistor element R13 and a capacitor C12 and is connected to a signal output terminal OUT. The collector of the transistor Tr is connected to the input terminal of the driving voltage Vcc. The input terminal of the driving voltage Vcc is grounded via a capacitor C13 with respect to high frequencies. A circuit including the resonator element XD, the transistor Tr, the resistor elements R11 to R13, and capacitors C11 to C13 constitutes the oscillator circuit 2.

The oscillator circuit 2 having such a structure functions as a Colpitts oscillator circuit using the transistor Tr having a negative resistance characteristic. The oscillation frequency of the oscillator circuit 2 changes in accordance with the capacitance of the first and second varactor diodes VD1 and VD2 of the oscillation frequency controller circuit 1. Since the first and second varactor diodes VD1 and VD2 are elements whose capacitance change according to the applied voltage values, by changing the applied voltage value to the first and second varactor diodes VD1 and VD2, the oscillation frequency is controlled. In other words, a voltage controlled oscillator capable of controlling frequency with voltage is constructed.

Figure 2:
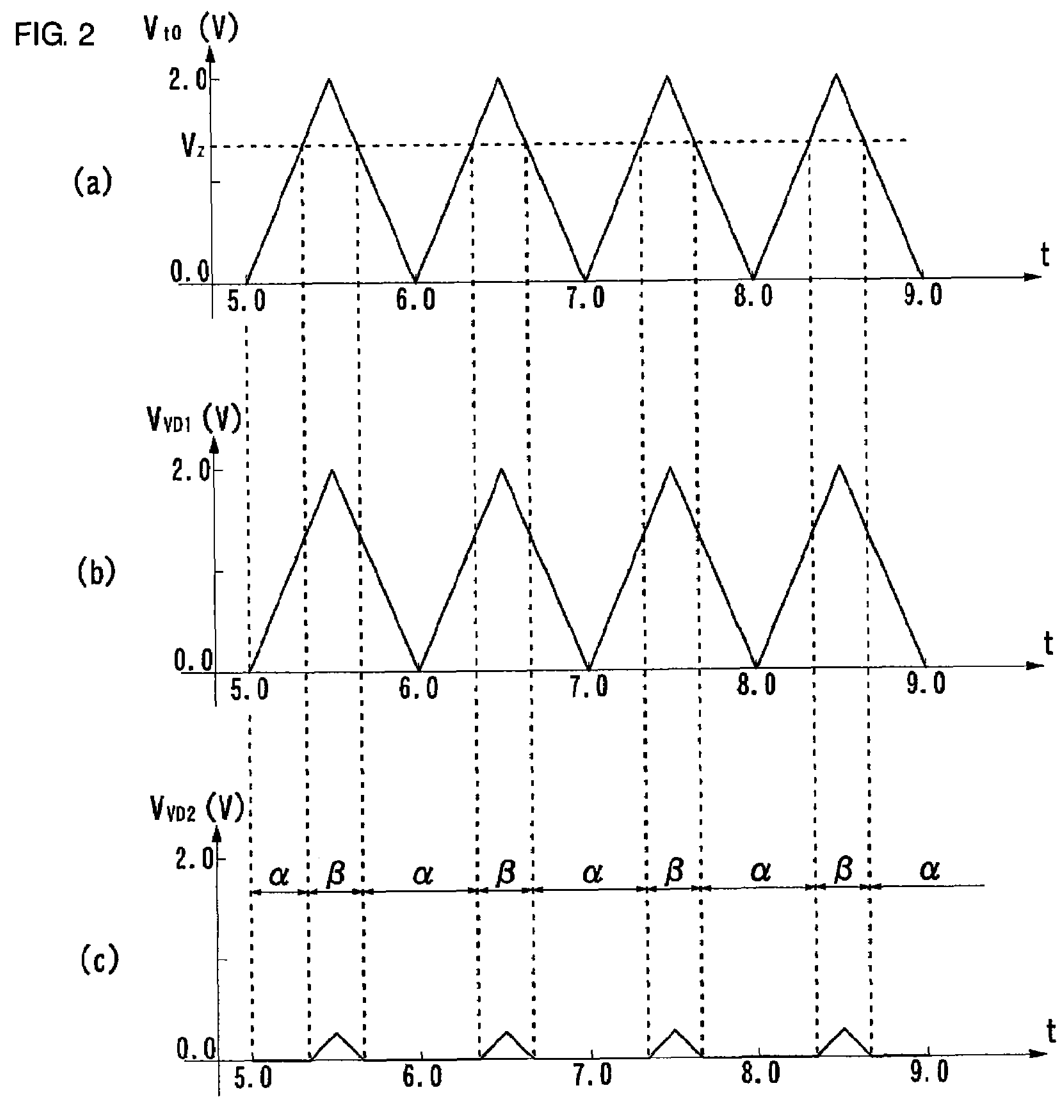
FIGS. 2(*a*)-(*c*) are waveform diagrams illustrating a signal (Vt0) output from a triangular wave generator circuit 3, a voltage (VVD1) applied to a first varactor diode VD1, and a voltage (VVD2) applied to a second varactor diode VD2.
Figure 3:
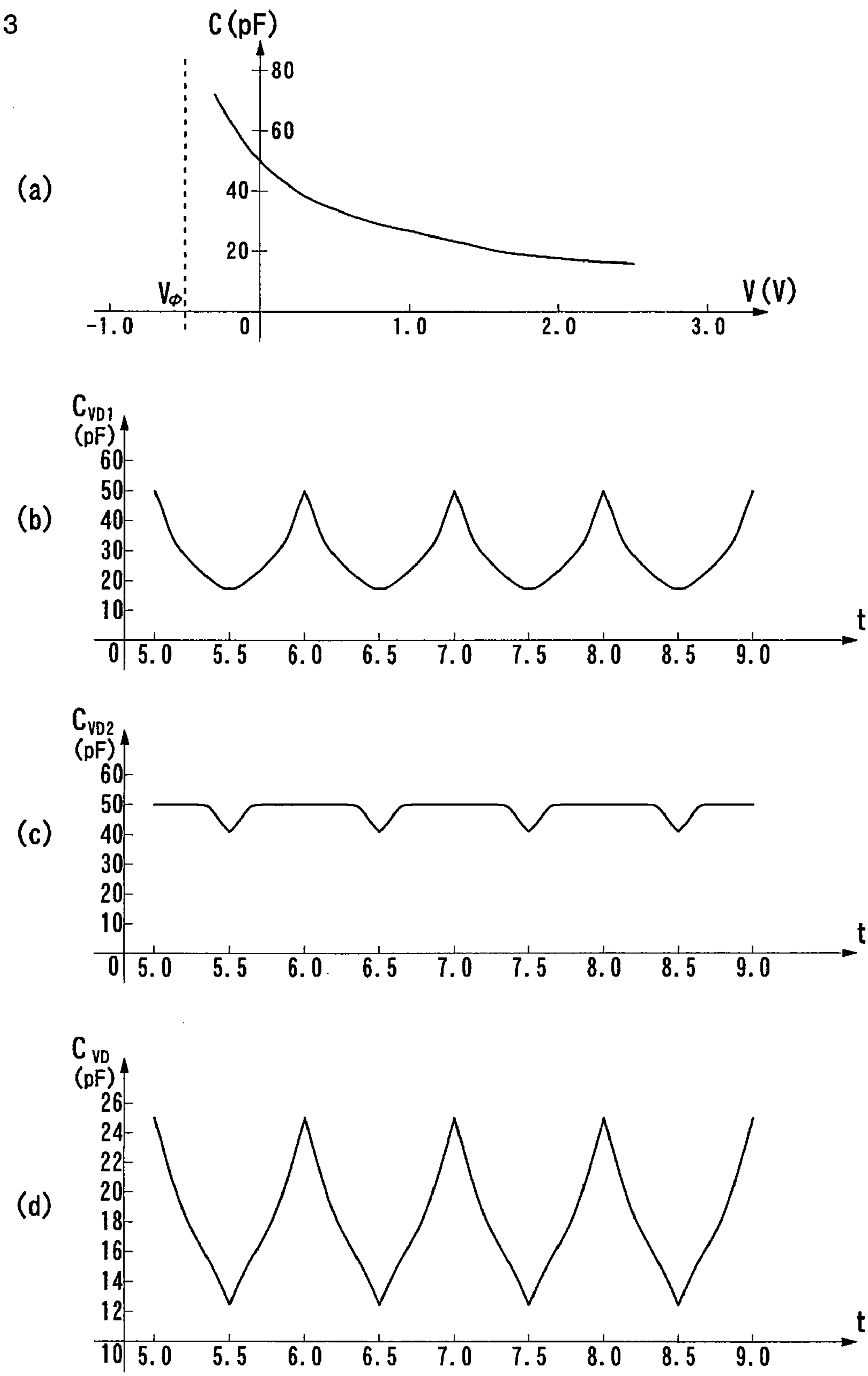
FIGS. 3(*a*)-3(*d*) are characteristic diagrams illustrating the capacitance-to-applied voltage characteristic of a varactor diode, a diagram illustrating the change over time of capacitance CVD1 of the first varactor diode VD1, a diagram illustrating the change over time of capacitance CVD2 of the second varactor diode VD2, and a diagram illustrating the change over time of combined capacitance CVD of the first varactor diode VD1 and the second varactor diode VD2.

The operation of a voltage controlled oscillator having such a structure will be described with reference to FIGS. 2 to 4. FIG. 2(*a*) is a waveform diagram of a signal (Vt0) output from the triangular wave generator circuit 3; FIG. 2(*b*) is a waveform diagram of a voltage (VVD1) applied to the first varactor diode VD1; and FIG. 2(*c*) is a waveform diagram of a voltage (VVD2) applied to the second varactor diode VD2. FIG. 3(*a*) is a characteristic diagram illustrating the capacitance-to-applied voltage characteristic of a varactor diode; FIG. 3(*b*) illustrates the change over time in capacitance CVD1 of the first varactor diode VD1 when the triangular wave signal illustrated in FIG. 2(*a*) is applied; FIG. 3(*c*) illustrates the change over time in capacitance CVD2 of the second varactor diode VD2; and FIG. 3(*d*) illustrates the change over time in combined capacitance CVD of the first varactor diode VD1 and the second varactor diode VD2.

Figure 4:
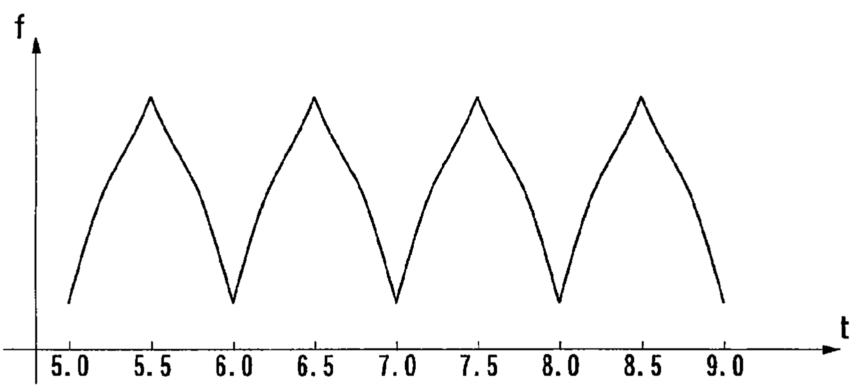
FIG. 4 illustrates the change over time of the frequency of an output signal of the voltage controlled oscillator according to the first embodiment.

FIG. 4 illustrates the oscillation frequency of the voltage controlled oscillator, i.e., the change over time in frequency of an output signal.

When the triangular wave voltage signal (hereinafter simply referred to as a "triangular wave signal") illustrated in FIG. 2(*a*) is output from the triangular wave generator circuit 3, the triangular wave signal is applied to the cathodes of the zener diode ZD1 and the first varactor diode VD1. The zener diode ZD1 used here breaks down when a voltage lower than the peak-to-peak value of the triangular wave signal is applied in the inverse direction (from the cathode side to the anode side). According to this embodiment, a zener diode whose break down voltage Vz is substantially 1.4 V may be used as the zener diode ZD1. Therefore, in the sections where the voltage value (amplitude) of the triangular wave signal is smaller than the break down voltage Vz, the zener diode ZD1 is in an open state. Since the anode of the first varactor diode VD1 is grounded via the inductor RFC3, the triangular wave signal is applied to the first varactor diode VD1. Since the high-frequency bypass capacitor C2 is connected between the first varactor diode VD1 and the second varactor diode VD2, the triangular wave signal is not applied to the second varactor diode VD2 and the resistor element R2. In this way, in the sections where the voltage of the triangular wave signal is low, i.e., the sections where the voltage of the triangular wave signal is lower than the break down voltage of the zener diode (sections $\alpha$ in FIG. 2(*c*)), the triangular wave signal is applied substantially only to the first varactor diode VD1.

When the voltage value (amplitude) of the triangular wave signal exceeds the break down voltage Vz (sections $\beta$ in FIG. 2(*c*)), the zener diode ZD1 functions as a constant voltage element. Therefore, a voltage obtained by subtracting the break down voltage Vz of the zener diode ZD1 from the voltage value of the triangular wave signal is applied to the resistor element R2. In this way, a voltage signal is applied to the second varactor diode VD2 in the same manner as the resistor element R2. At this time, the triangular wave signal is applied to the first varactor diode VD1 in the same manner as in the case of the low voltage, described above.

By employing such a circuit configuration, the triangular wave signal continues to be applied, without any substantial changes, to the first varactor diode VD1, without depending on the voltage value (amplitude) of the triangular wave signal (refer to FIG. 2(*b*)). A voltage obtained by subtracting the break down voltage from the triangular wave signal is applied to the second varactor diode VD2 in the sections where the voltage value of the triangular wave signal is greater than a predetermined voltage value, or, more specifically, sections where the voltage value of the triangular wave signal is greater than the break down voltage Vz of the zener diode ZD1 (refer to FIG. 2(*c*)).

When the voltage signal shown in FIG. 2(*b*) is applied to the first varactor diode VD1, the capacitance of the first varactor diode VD1 changes as illustrated in FIG. 3(*b*). More specifically, in the sections where the applied voltage is small, the capacitance changes abruptly in accordance with the voltage value, whereas in the sections where the applied voltage is great, the capacitance changes gently. This is because the first and second varactor diodes VD1 and VD2 have the characteristic shown in FIG. 3(*a*). As shown in the drawing, the capacitance of the first and second varactor diodes VD1 and VD2 changes abruptly when the applied voltage is a negative voltage (i.e., when the potential of the anode is greater than the potential of the cathode), a zero voltage, or a positive but low voltage (i.e., when the potential of the cathode is greater than the potential of the anode), whereas the capacitance changes gently when the applied voltage is a positive and high voltage.

On the other hand, the capacitance of the second varactor diode VD2 changes as shown in FIG. 3(*c*). More specifically, in the sections where the voltage of the triangular wave signal is low, the capacitance corresponds to zero voltage since a voltage is not applied, and, when the voltage of the triangular wave signal exceeds the break down voltage Vz of the zener diode ZD1, the capacitance changes abruptly in accordance with the applied voltage. This is because, even when the voltage of the triangular wave signal is high, a low voltage obtained by subtracting the break down voltage Vz of the zener diode ZD1 from the voltage of the triangular wave signal is applied to the second varactor diode VD2.

As the values of the capacitance of the first and second varactor diodes VD1 and VD2 change as described above, the combined capacitance of the series circuit 11 changes as shown in FIG. 3(*d*). The combined capacitance changes in such manner because, in the sections where the triangular wave signal is low, the capacitance of the second varactor diode VD2 remains high and does not change and the capacitance of the first varactor diode VD1 changes abruptly. In the sections the triangular wave signal is high, the capacitance of the first varactor diode VD1 continues to change gently and the capacitance of the second varactor diode changes abruptly.

By employing such a structure, the capacitance of the series circuit 11 of the first and second varactor diodes VD1 and VD2 can be changed abruptly near the peaks of the triangular wave signal, without depending on the voltage of the triangular wave signal. In this way, the oscillation frequency of the oscillator circuit 2 can be changed abruptly, as shown in FIG. 4. As a result, the frequencies of the signal output from the voltage controlled oscillator can be spread out, and the frequencies of noise can be spread out. In other words, a voltage controlled oscillator having an excellent EMI suppression effect can be configured.

Next, a voltage controlled oscillator according to a second embodiment will be described with reference to FIG. 5.

Figure 5:
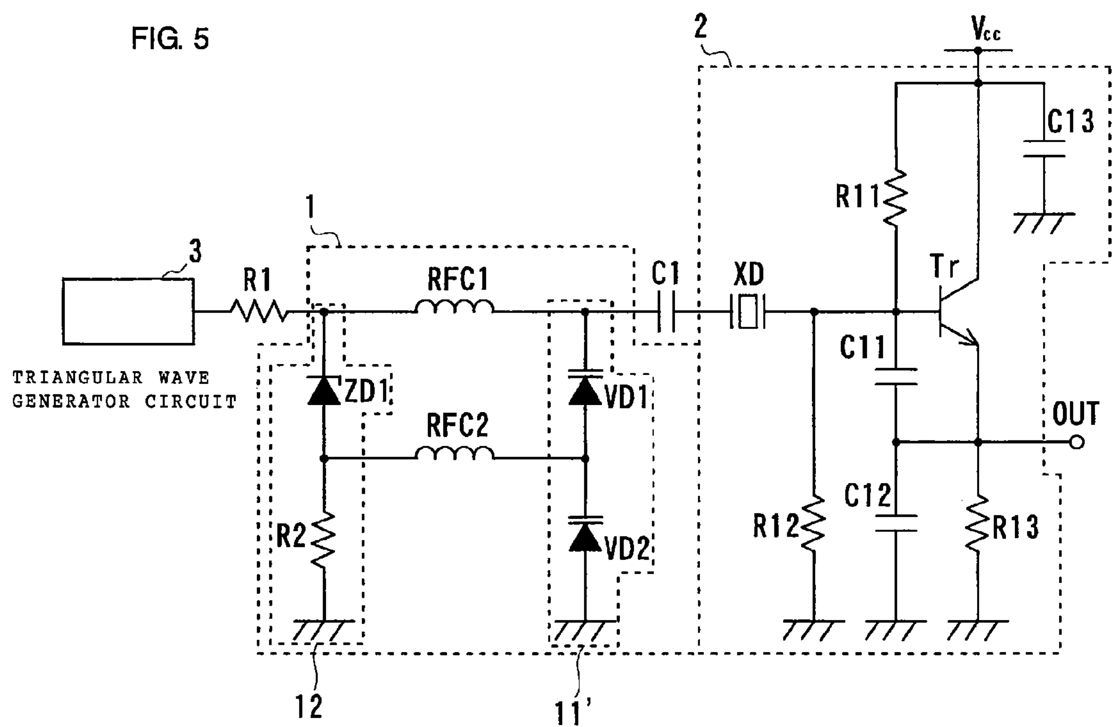
FIG. 5 is an equivalent circuit diagram illustrating a voltage controlled oscillator according to a second embodiment.

FIG. 5 is an equivalent circuit diagram of the voltage controlled oscillator according to this embodiment.

The voltage controlled oscillator illustrated in FIG. 5 has the same structure as that according to the first embodiment except that the series circuit 11 of the voltage controlled oscillator according to the first embodiment is replaced with a series circuit 11' that includes a first varactor diode VD1 and a second varactor diode VD2 connected in series, without a high-frequency bypass capacitor being provided and without the node being grounded via an inductor. In other words, the voltage controlled oscillator according to this embodiment (FIG. 5) is the same as the voltage controlled oscillator according to the first embodiment (FIG. 1) except that the high-frequency bypass capacitor C2 and the inductor RFC3 are omitted.

For the voltage controlled oscillator having the above-described structure, when the voltage output from the triangular wave generator circuit 3 is smaller than the break down voltage Vz of the zener diode ZD1, the voltage is applied only to the first varactor diode VD1, in the same manner as the above-described first embodiment. The capacitance of the first varactor diode VD1 changes in accordance with the applied voltage. Since almost no voltage is applied to the second varactor diode VD2, the capacitance corresponds to a zero voltage. Next, when the voltage output from the triangular wave generator circuit 3 exceeds the break down voltage Vz of the zener diode ZD1, the zener diode ZD1 functions as a constant voltage element having a voltage value Vz. This constant voltage value Vz is applied to the first varactor diode VD1, and substantially no changes occur. Therefore, the capacitance of the first varactor diode VD1 becomes substantially constant in accordance with the voltage value Vz. Since a voltage obtained by subtracting the constant voltage value Vz of the first varactor diode VD1 from the voltage of the triangular wave signal is applied, this differential voltage is also applied to the second varactor diode VD2, and the capacitance of the second varactor diode VD2 changes in accordance with the change in the differential voltage. Since the voltage applied to the second varactor diode VD2 is a voltage obtained by subtracting the voltage Vz of the first varactor diode VD1 from the voltage of the triangular wave signal, the voltage is small, and the change in the capacitance of the second varactor diode VD2 becomes great. Therefore, the capacitance of the series circuit 11' being constituted of the first varactor diode VD1 and the second varactor diode VD2, i.e., the combined capacitance of the capacitance of the first varactor diode VD1 and the capacitance of the second varactor diode VD2, is not as great as that according to the first embodiment but changes relatively abruptly in accordance with the change in voltage of the triangular wave signal.

In this way, the change in the frequency of the output signal of this voltage controlled oscillator does not become gentle in parts. Thus, a voltage controlled oscillator having a sufficient EMI suppression effect in the same manner as in the above-described voltage controlled oscillator according to the first embodiment is configured. Since the voltage controlled oscillator according to this embodiment has fewer components compared with the voltage controlled oscillator according to the first embodiment, a voltage controlled oscillator having an EMI suppression effect is configured with a simpler and smaller structure.

Next, a voltage controlled oscillator according to a third embodiment will be described with reference to FIGS. 6 and 7.

Figure 6:
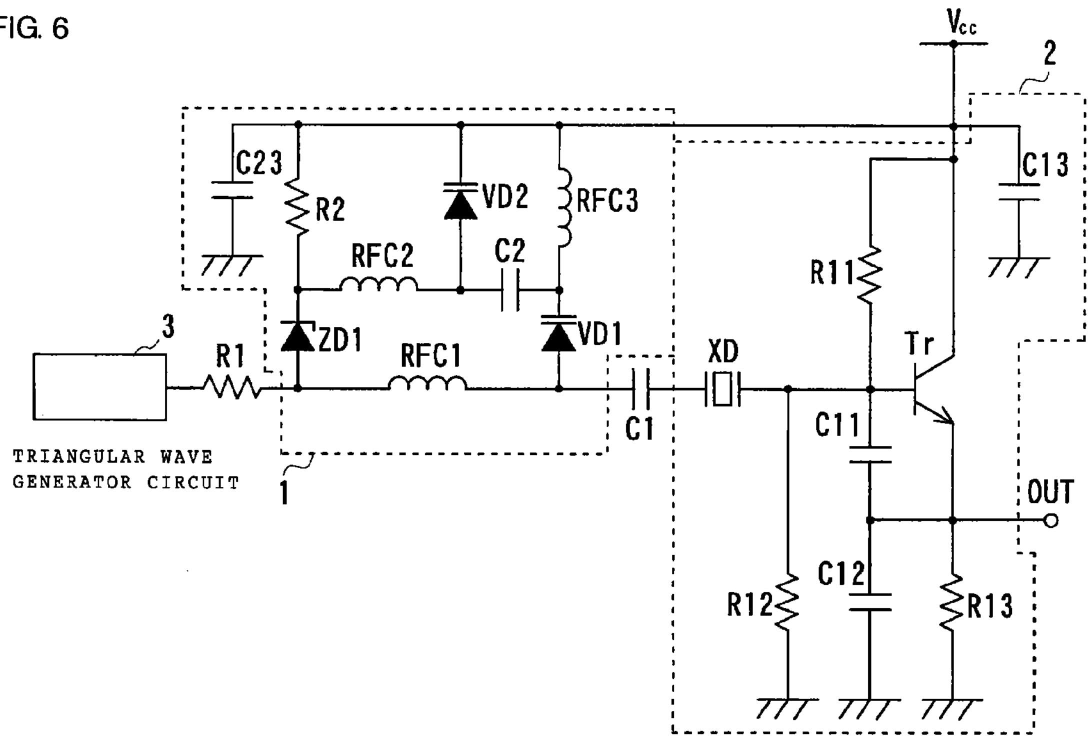
FIG. 6 is an equivalent circuit diagram illustrating a voltage controlled oscillator according to a third embodiment.

FIG. 6 illustrates an equivalent circuit diagram of the voltage controlled oscillator according to this embodiment.

The voltage controlled oscillator illustrated in FIG. 6 has the same structure as that of the voltage controlled oscillator according to the first embodiment except that the ground potential (fixed potential) of the oscillation frequency controller circuit 1 of the voltage controlled oscillator according to the first embodiment is replaced by a potential generated by a constant voltage source Vcc.

More specifically, the anode of the zener diode ZD1 is connected to the node of the oscillation frequency controller circuit 1 and the resistor element R1, whereas the cathode of the zener diode ZD1 is connected to the constant voltage source Vcc (also functioning as a driving voltage source) via the resistor element R2.

The anode of the zener diode ZD1 is connected to the anode of the first varactor diode VD1 via the inductor RFC1. The cathode of the first varactor diode VD1 is connected to the anode of the second varactor diode VD2 via the high-frequency bypass capacitor C2, whereas the cathode of the second varactor diode VD2 is connected to the constant voltage source Vcc. The anode of the first varactor diode VD1 is connected to the resonator element XD of the oscillator circuit 2 via the capacitor C1. The cathode of the first varactor diode VD1 is connected to the constant voltage source Vcc via the inductor RFC3. The anode of the second varactor diode VD2 is connected to the resistor element R2 via the inductor RFC2. The connecting terminal of the constant voltage source Vcc is grounded via a high-frequency bypass capacitor C23 with respect to high frequencies. According to this embodiment, the potential of the constant voltage source Vcc is referred to as a "fixed potential" according to this embodiment of the present invention.

In a voltage controlled oscillator having such a structure, a differential voltage of the voltage of the output signal from the triangular wave generator circuit 3 and the constant voltage source Vcc is applied to the zener diode ZD1 and the first and second varactor diodes VD1 and VD2, and each of these components operate by this differential voltage. Therefore, the oscillation frequency of the voltage controlled oscillator changes in a manner illustrated in FIG. 7(*a*), which is opposite to that illustrated in FIG. 4 according to the first embodiment.

Figure 7:
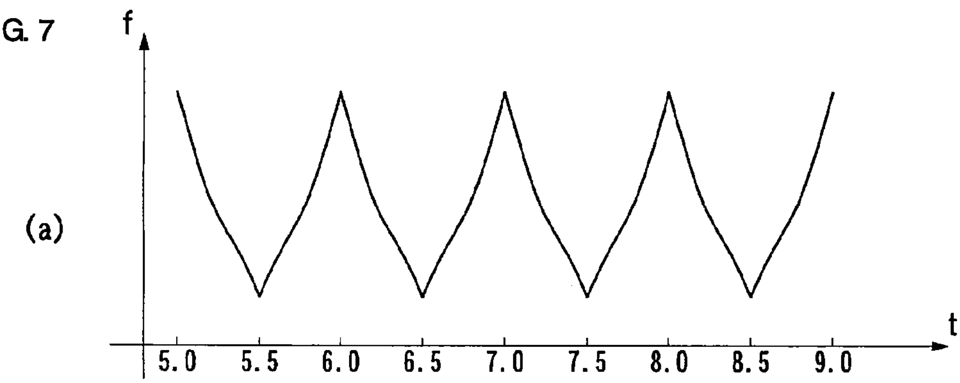
FIGS. 7(*a*) and 7(*b*) respectively illustrate the change over time of the frequency of an output signal of the voltage controlled oscillator according to the third embodiment and the change over time of the frequency of an output signal of a known voltage controlled oscillator.
Figure 7:
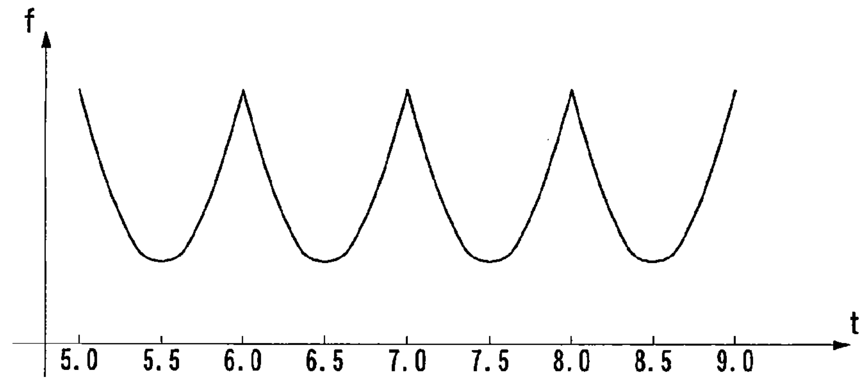

FIG. 7(*a*) illustrates the change over time of the frequency of the output signal from the voltage controlled oscillator according to this embodiment, and FIG. 7(*b*) illustrates the change over time of the frequency of the output signal from a known voltage controlled oscillator including one varactor diode.

More specifically, when a differential voltage based on a voltage from a constant voltage source and a voltage of a triangular wave signal is applied to a varactor diode, the frequency change near the peaks on the low frequency side is gentle for a known voltage controlled oscillator, whereas, for the voltage controlled oscillator according to this embodiment, the frequency change near the peaks on the low frequency side become abrupt.

Accordingly, in the same manner as the above-described embodiments, a voltage controlled oscillator having an excellent EMI suppression effect can be configured.

Next, a voltage controlled oscillator according to a fourth embodiment will be described with reference to FIG. 8.

Figure 8:
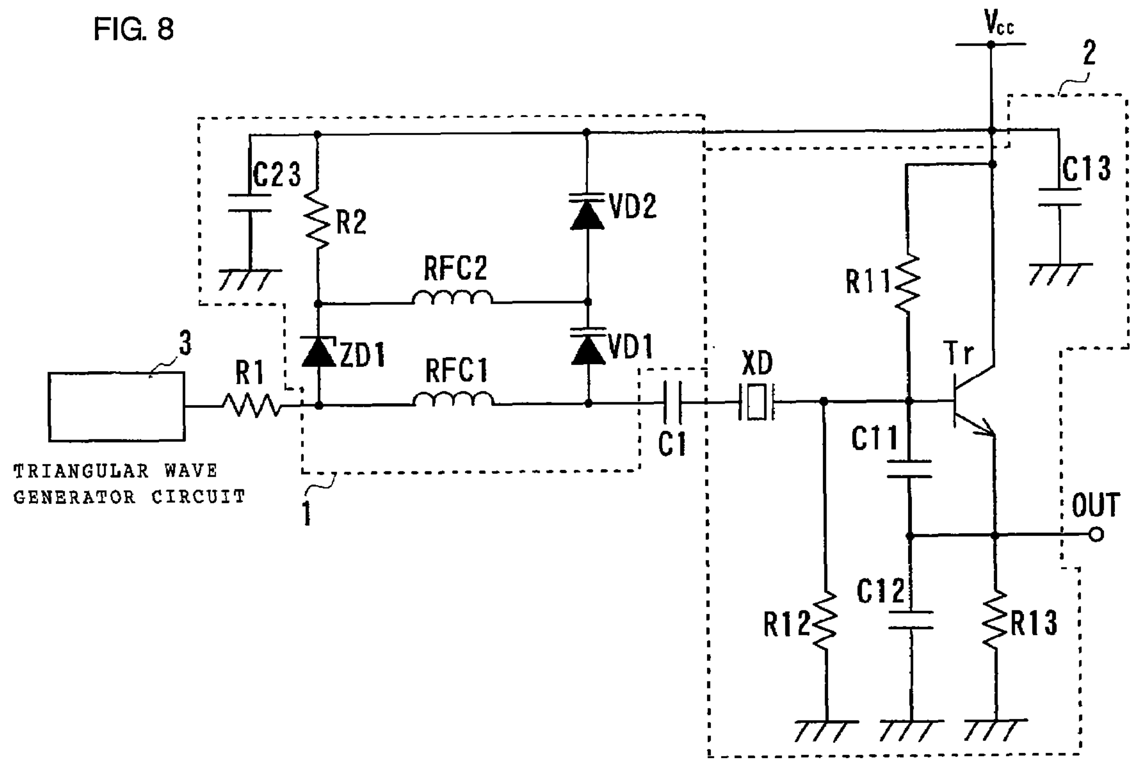
FIG. 8 is an equivalent circuit diagram illustrating a voltage controlled oscillator according to a fourth embodiment.
Figure 9:
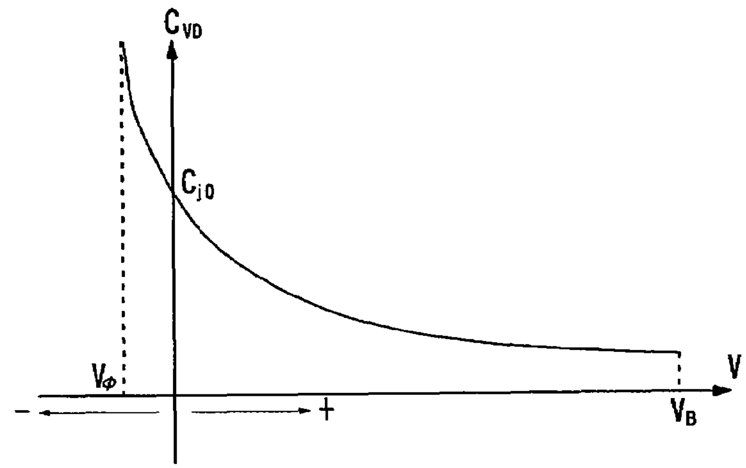
FIG. 9 illustrates the capacitance-to-applied voltage characteristic of a varactor diode.
Figure 10:
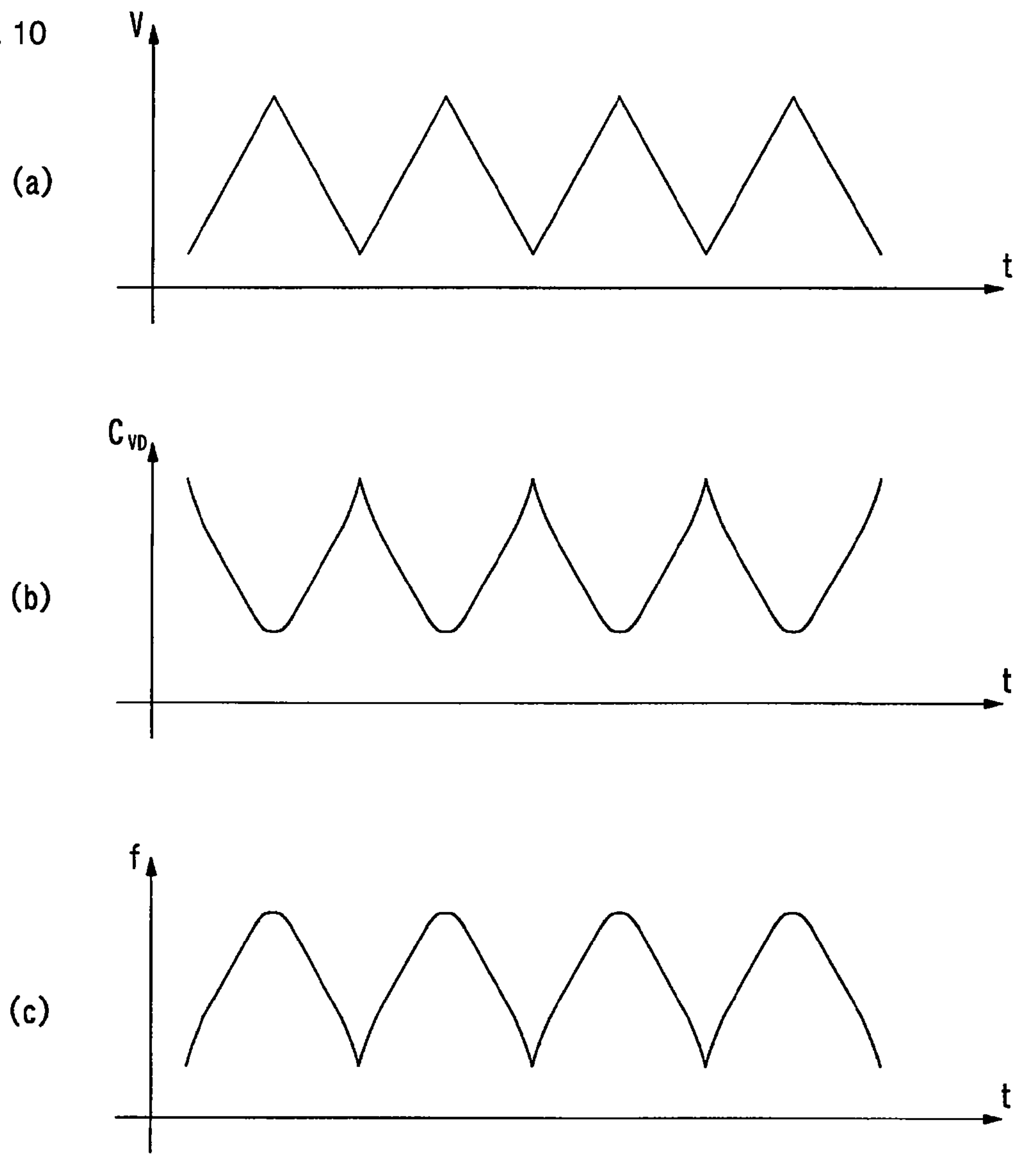
FIG. 10 illustrates the change over time of a signal applied to the varactor diode, the capacitance of the varactor diode, and the frequency of an output signal of the voltage controlled oscillator including the varactor diode.

FIG. 8 illustrates an equivalent circuit diagram of the voltage controlled oscillator according to this embodiment.

In the voltage controlled oscillator according to this embodiment: the first varactor diode VD1 and the second varactor diode VD2 are connected in series; a high-frequency bypass capacitor is not connected between the first varactor diode VD1 and the second varactor diode VD2; and the node is not connected to the constant voltage source Vcc via an inductor. The other structure of the voltage controlled oscillator according to this embodiment is the same as that of the voltage controlled oscillator according to the third embodiment. More specifically, the voltage controlled oscillator according to this embodiment (FIG. 8) is the same as the voltage controlled oscillator according to the third embodiment (FIG. 6) except that the high-frequency bypass capacitor C2 and the inductor RFC3 are omitted. Likewise, it corresponds to the voltage controlled oscillator according to the second embodiment (FIG. 5) configured on the basis of the voltage controlled oscillator according to the first embodiment (FIG. 1). Therefore, the operation of the voltage controlled oscillator according to this embodiment can be easily understood by referring to the operations of the voltage controlled oscillators according to the second and third embodiments. Thus, description of the operation is omitted here. However, as a result of employing the structure according to this embodiment, a voltage controlled oscillator having a sufficient EMI suppression effect can be configured with a simple and small structure.

Although the present invention has been described in relation to particular embodiments thereof, many other variations and modifications and other uses will become apparent to those skilled in the art. Therefore, the present invention is not limited by the specific disclosure herein.

What is claimed is:

1. A voltage controlled oscillator comprising:

an oscillator circuit configured to generate a predetermined oscillation frequency signal, the oscillator circuit including a resonator element; and an oscillation frequency controller circuit configured to control the oscillation frequency of the oscillator circuit by a control voltage signal, wherein the oscillation frequency controller circuit includes:

a first series circuit disposed between one end of the resonator element and a fixed potential, the first series circuit comprising a first varactor diode and a second varactor diode connected in series in this order from the resonator element side for carrying an alternating current, and a second series circuit disposed between an input terminal of the control voltage signal and the fixed potential, the second series circuit comprising a zener diode and a resistor element connected in series in this order from the input terminal side, wherein a terminal of the first varactor diode on the resonator element side and a terminal of the zener diode on the input terminal side are connected for carrying a direct current, and wherein a terminal of the second varactor diode on the first varactor diode side and a terminal of the resistor element on the zener diode side are connected for carrying a direct current.

2. The voltage controlled oscillator according to claim 1, wherein the terminal of the first varactor diode on the second varactor diode side is connected to the fixed potential for carrying a direct current.

3. The voltage controlled oscillator according to claim 1, wherein the terminal of the first varactor diode on the second varactor diode side is connected to the terminal of the zener diode on the resistor element side for carrying a direct current.

4. The voltage controlled oscillator according to claim 1, wherein said fixed potential is a ground potential.

5. The voltage controlled oscillator according to claim 2, wherein said fixed potential is a ground potential.

6. The voltage controlled oscillator according to claim 3, wherein said fixed potential is a ground potential.

7. The voltage controlled oscillator according to claim 1, wherein said fixed potential is a supply voltage potential of said oscillator circuit.

8. The voltage controlled oscillator according to claim 2, wherein said fixed potential is a supply voltage potential of said oscillator circuit.

9. The voltage controlled oscillator according to claim 3, wherein said fixed potential is a supply voltage potential of said oscillator circuit.

* * * * *